United States Patent [19]
Huang

[11] Patent Number: 5,998,811
[45] Date of Patent: Dec. 7, 1999

[54] TRENCH EMITTER CONTROLLED THYRISTOR

[75] Inventor: Qin Huang, Blacksburg, Va.

[73] Assignee: Intersil Corporation, Palm Bay, Fla.

[21] Appl. No.: 09/024,117

[22] Filed: Feb. 17, 1998

[51] Int. Cl.$^6$ .................... H01L 29/745; H01L 29/749
[52] U.S. Cl. .................... 257/153; 257/138; 257/152
[58] Field of Search .................. 257/138, 152, 257/153

[56] References Cited

U.S. PATENT DOCUMENTS

| | | | |
|---|---|---|---|
| 4,799,095 | 1/1989 | Baliga | 257/138 |
| 4,827,321 | 5/1989 | Baliga | 257/138 |
| 5,304,821 | 4/1994 | Hagino | 257/138 |
| 5,471,075 | 11/1995 | Shekar | 257/138 |
| 5,477,064 | 12/1995 | Terashima | 257/138 |
| 5,488,236 | 1/1996 | Baliga | 257/138 |
| 5,554,862 | 9/1996 | Omura | 257/138 |
| 5,659,185 | 8/1997 | Iwamuro | 257/138 |

OTHER PUBLICATIONS

Bhalla, *IEEE Elec. Dev. Let*.vol. 16, No. 2, Feb. 1995 "ESTD in Diverter".
Sridhar, *IEEE Elec. Dev. Lett* vol. 77, no. 1, Jan. 1996 "The Dual Gate . . . (DG–EST)".

Primary Examiner—Jerome Jackson, Jr.
Attorney, Agent, or Firm—Rogers & Killeen

[57] ABSTRACT

A trench emitter controlled thyristor 30 having a collector layer 32, a drift layer 34, a body layer 36, and a floating layer 38. Each of the layers 32, 34, 36, and 38 contacts the adjacent layer(s). The floating layer 38 does not cover the entirety of the adjacent layer (the body layer 36) but at one of the lateral ends of the thyristor 30, an emitter 40 is formed. A gate area (or electrode) 43 is formed to span laterally across the thyristor 30. Additionally, trenches are formed into the lateral edges 44 of the body layer 36 and a portion of the drift layer 34. Within the trenches 44 are formed additional gate area 42 which runs for substantially the length of the thyristor 30. The gate 42 is kept electrically isolated from the remainder of the thyristor by an insulating region 46 directly over the body layer 36.

22 Claims, 5 Drawing Sheets

PRIOR ART (EST)

TRENCH EMITTER CONTROLLED THYRISTOR

BACKGROUND OF THE INVENTION

The present invention relates generally to high power semiconductor switching devices and, in particular, to thyristors with trench emitter control.

The utility of thyristors is well known. Thyristors are usually four layer devices, each adjacent layer having an opposite conductivity type from its adjacent layers. As known to those skilled in the art, a simple thyristor generally includes a four-layer P1-N1-P2-N2 device with three P-N junctions in series, J1, J2 and J3 respectively. The four layers correspond to the anode (P1), the first base region (N1), the second base (or P base) region (P2) and the cathode (N2) respectively. In the forward blocking state, the anode is biased positive with respect to the cathode and junctions J1 is forward biased and J2 and J3 are reverse biased and most of the forward voltage drop occurs across the central junction J2. In the forward conducting state, all three junctions are forward biased and the voltage drop across the device is very low, approximately equal to the voltage drop across a single forward biased P-N junction.

An inherent limitation to the use of thyristors for high current applications is sustained latch-up, generally arising from the action of the coupled P1-N1-P2 and N1-P2-N2 bipolar transistors which make up the four layers of the thyristor. Destruction of the thyristor can occur if the latch-up current is not sufficiently controlled by external circuitry or by reversing anode potential. Alternatively, the latch-up current can be controlled by the use of a MOSFET or similar device for controlling turn on and turn off.

Several methods exist for obtaining MOS gate control over thyristor action. One of the more successful methods is a MOS-controlled thyristor, in which turn off is provided by shorting the emitter-base junction of the N-P-N transistor to thereby reduce the gain of the device. For example, an MCT may include an P-channel MOSFET integrated into the cathode region of the thyristor for turn-off control and an N-channel MOSFET integrated into the P Base region for turn on control. (See, for example, the article published by Victor A. K. Temple, published in IEDM Technology Digest, pp. 282–285 (1984).)

Still, it is desirable to obtain power switch devices which can conduct more current than prior devices and yet provide reliable control and safe operating area. Additionally, such devices can be improved if the devices have a higher current saturation capability and smaller temperature dependence. One such device which has recently been studied is an Emitter Switched Thyristor ("EST") as shown in FIG. 5. In the EST 10, a four layer structure is used including a collector region 12, a drift region 14, a body region 16, and a floating region 18. At the top of the device an emitter 20 is placed over and in the body region 16. A turn on gate 22 spans the portion of the body region 16 between the floating region 18 and the drift region 14. A turn off gate 24 spans the portion of the body region 16 between the emitter 20 and the floating region 18. As is well known, each of the gates operates selectively to establish a channel within the adjacent body portion 16 or the gates are tied together to form a threes terminal device. The EST is known to have a relatively large safe operating area and a fast switching spesed. The on-voltage of the EST is, however, about a half-volt higher than that of an MCT and is caused primarily by the voltage drop on the lateral MOSFET channel resistance. Since the on-voltage of the device represents its efficiency, it is highly desirable to obtain a device with similar properties but with a lower on-voltage . In addition, it is known that EST devices generally suffer from turn-on problems generally relating to the fact that the turn-on channel density is small because of the long floating N+ region's consumption of silicon area.

It is accordingly an object of the present invention to provide a thyristor which can be readily and effectively controlled.

It is another object of the present invention to provide a novel semiconductor device which can reliably switch relatively large amounts of voltage with a relatively small on-voltage.

It is still another object of the present invention to provide a novel semiconductor device which has a higher electron current density so that it will readily turn-on into the thyristor mode.

It is yet another object of the present invention to provide a novel semiconductor device and circuit which obviates the foregoing problems of power switching devices but provides comparable power switching capability with a lower forward voltage drop.

It is still a further object of the present invention to provide a novel semiconductor device which can safely operate as a thyristor and which can be readily fabricated using current MOSFET manufacturing processes.

These and other objects of the present invention will be known to those skilled in the art from the following descriptions of a preferred embodiment in view of the drawings.

DESCRIPTION OF THE PREFERRED EMBODIMENTS

Figure 1:
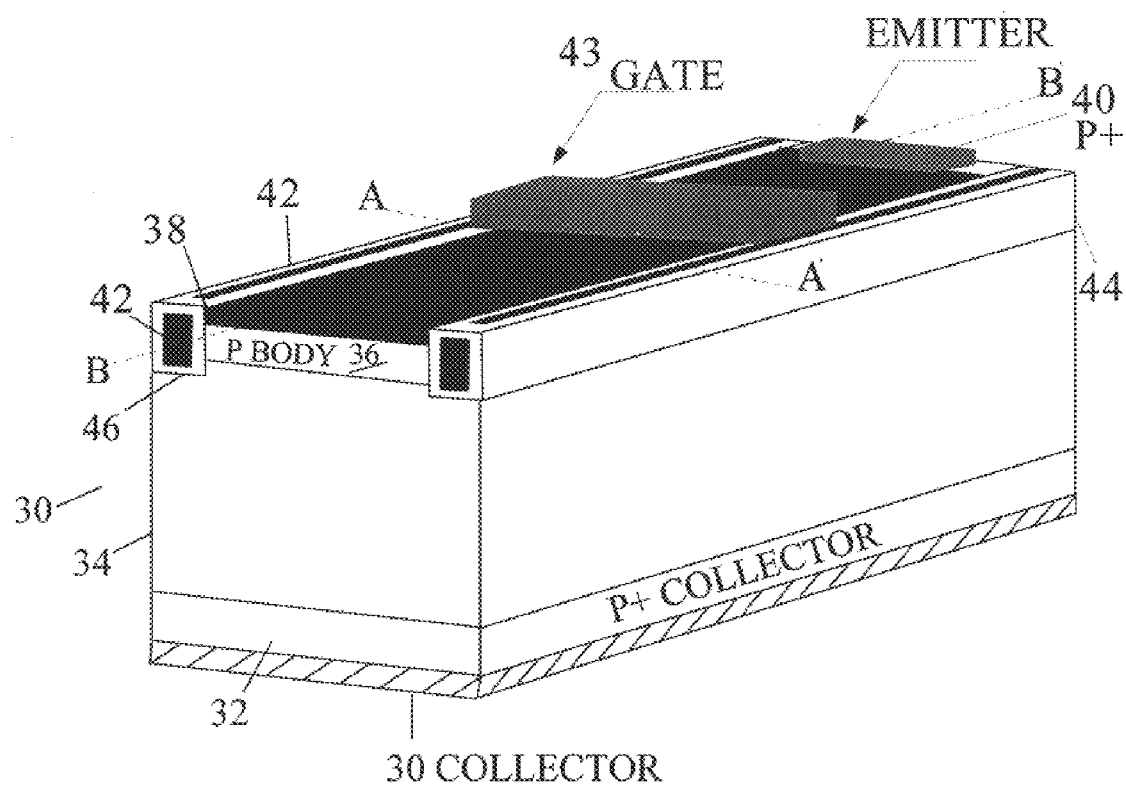
FIG. 1 is a pictorial diagram showing an embodiment of the trench emitter controlled thyristor of the present invention.
Figure 2:
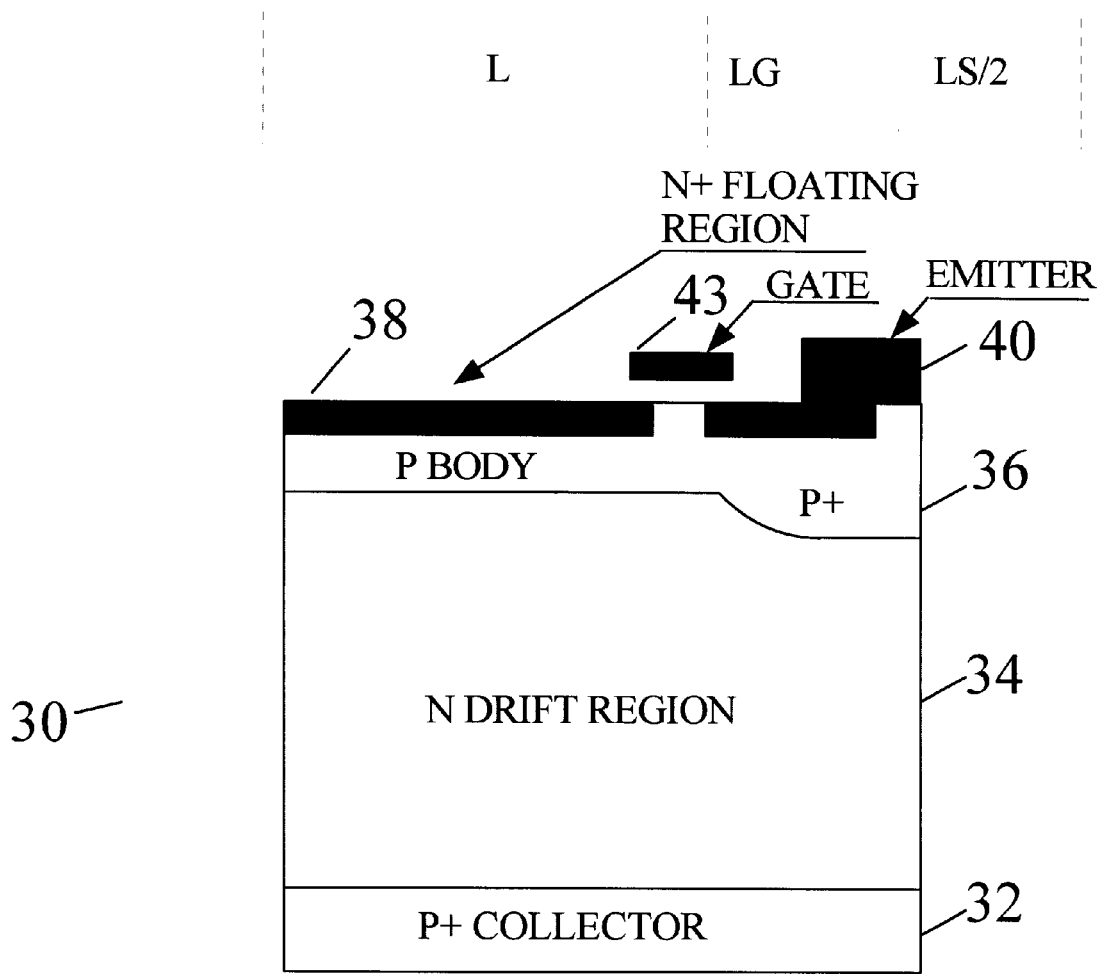
FIG. 2 is a pictorial diagram showing a cross section of an embodiment of the present invention along the line B–B' of FIG. 1.
Figure 3:
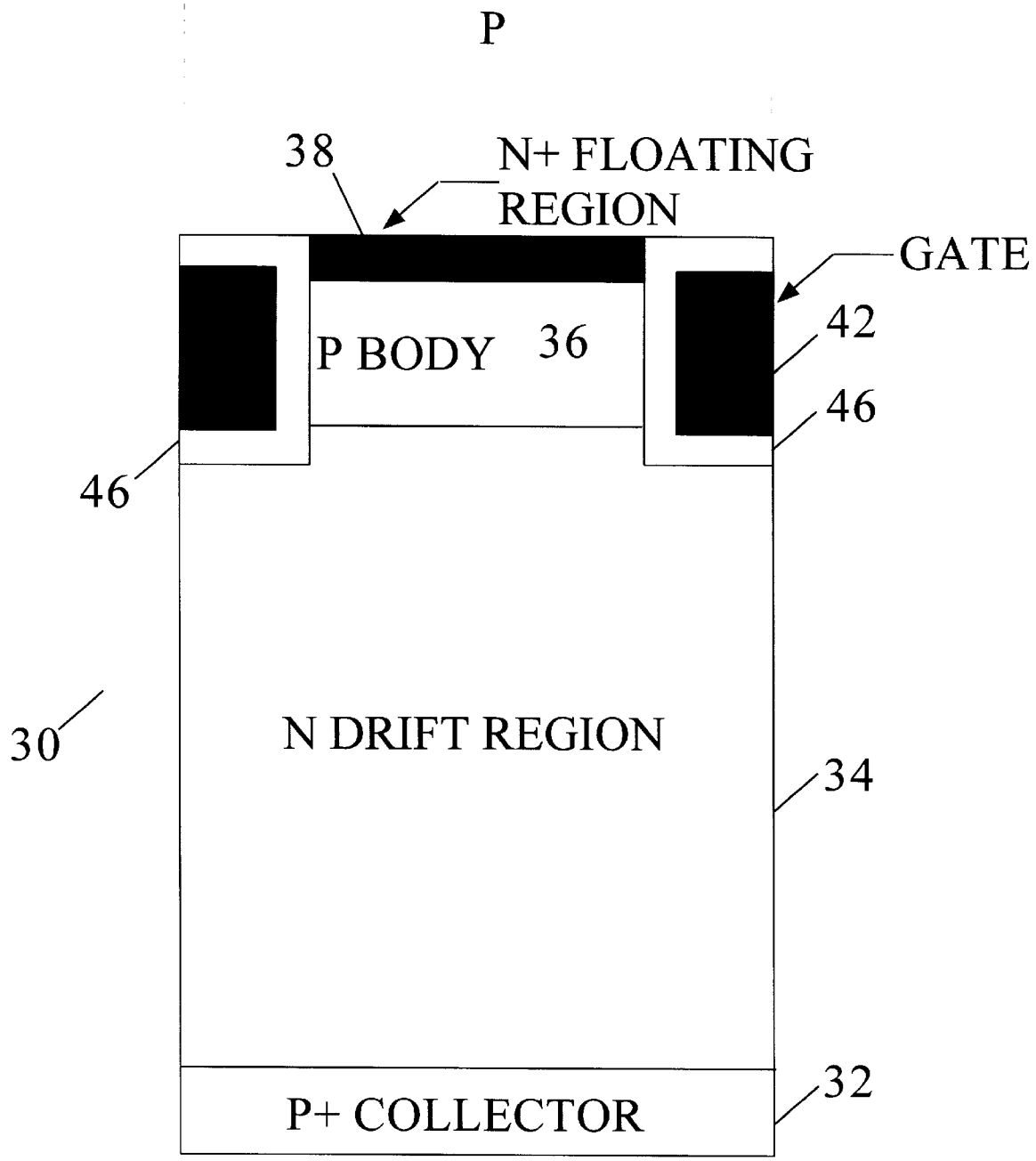
FIG. 3 is a pictorial diagram showing a cross section of an embodiment of the present invention along the line A–A' of FIG. 1.

With reference to FIGS. 1, 2 and 3, a thyristor 30 of the present invention may include a collector layer (or region) 32, a drift layer (or region) 34, a body layer (or region) 36, a floating layer (or region) 38. Each of the layers 32, 34, 36, and 38 contacts the adjacent layer(s) and may be formed in a conventional fashion. The floating layer 38 does not cover the entirety of the adjacent layer (the body layer 36) but at one of the lateral ends of the thyristor 30, an emitter 40 is formed. A gate area (or electrode) 43 is formed to span laterally across the thyristor 30. Additionally, trenches are formed into the lateral edges 44 of the body layer 36 and a portion of the drift layer 34. Within the trenches 44 are formed additional gate areas 42 which run for substantially the length of the thyristor 30. The gate 42 is kept electrically isolated from the remainder of the thyristor by an insulating region 46 directly over the body layer 36.

As shown in FIGS. 1, 2 and 3, the collector layer 32 may have a P+ conductivity, the drift layer an N conductivity, the body layer a P conductivity under the floating layer 38 and a P+ conductivity under the emitter area 40, and the floating region an N+ conductivity. As is well known in the art, the order of the conductivity of the layers may be reversed with suitable changes in associated circuitry. Likewise, the strength of the conductivity within the various layers may be changed from that shown in the thyristor 30 of FIGS. 1, 2 and 3. Such changes to the order and strength of the conductivities may be made by persons skilled in the art while still practicing the present invention.

Figure 4:
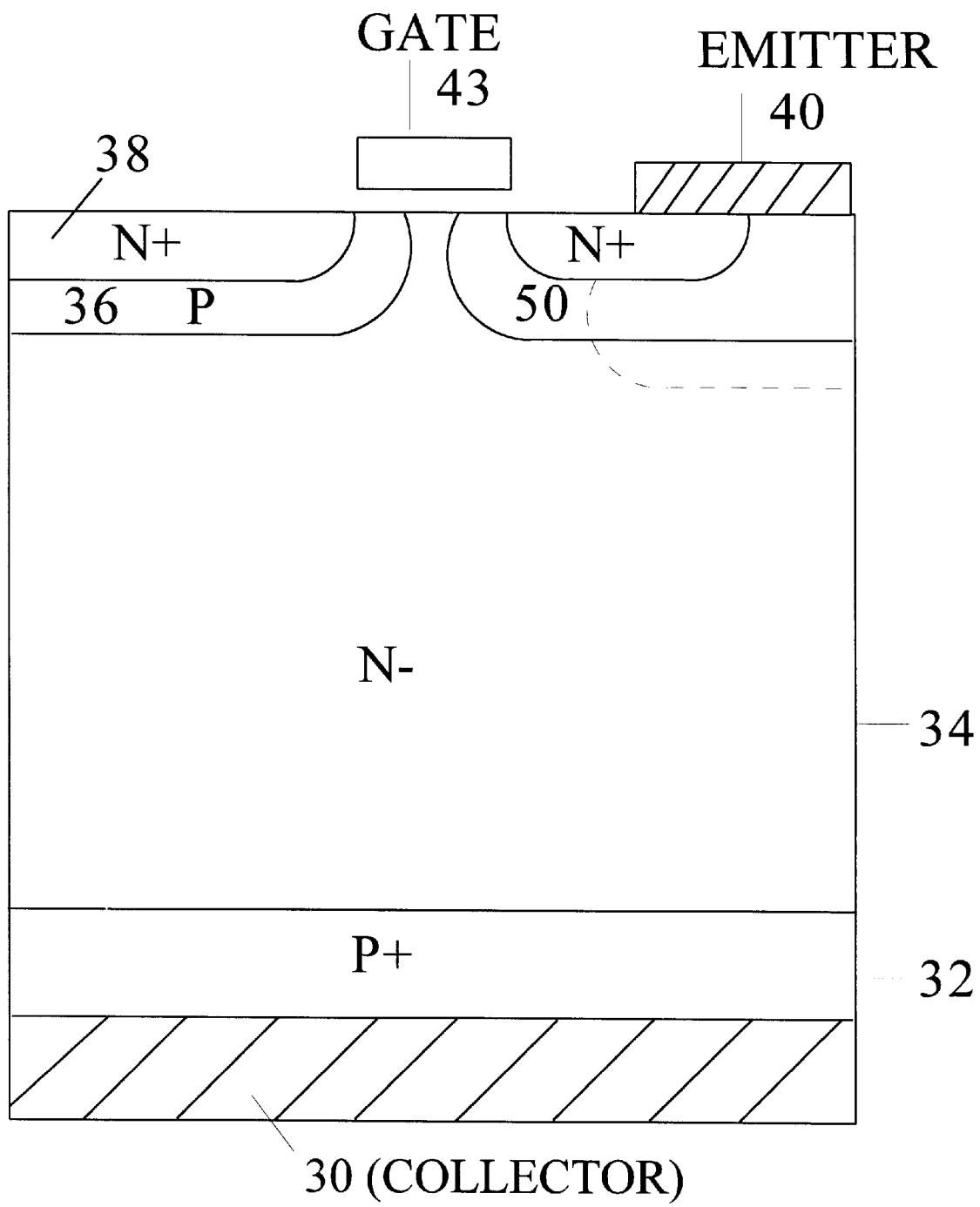
FIG. 4 is a pictorial diagram showing a cross section of an embodiment of the present invention along the line B–B' of FIG. 1; and, FIG. 5 is a pictorial diagram showing a prior art emitter controlled thyristor.
Figure 5:
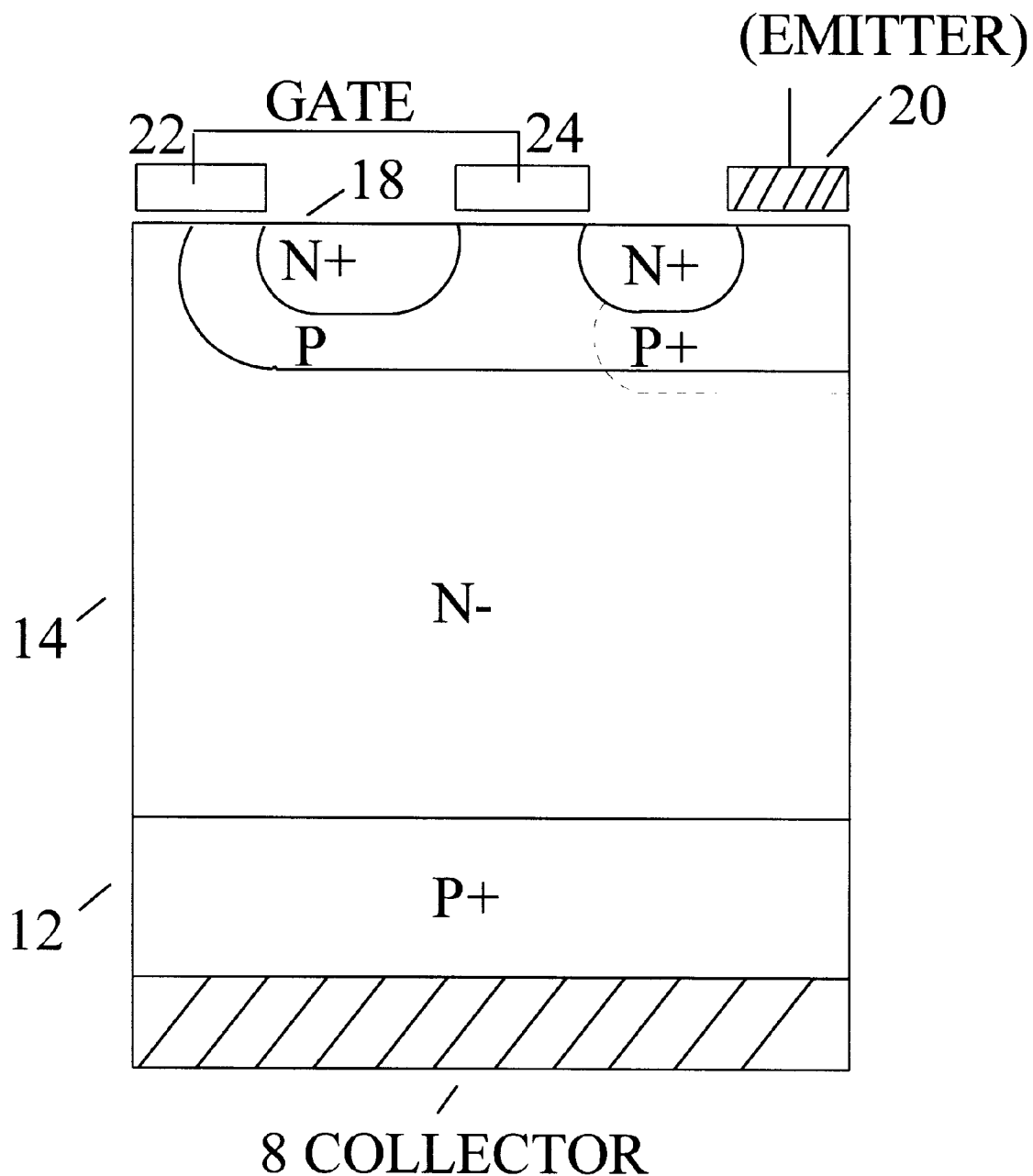

A Cross sectional view of FIG. 1 across line A–A' is illustrated in FIG. 2. A cross sectional of FIG. 1 across line B–B' is shown in FIG. 3. FIG. 4 shows a cross sectional view along line A–A' of FIG. 1 for another embodiment of the present invention.

In FIG. 4, the body region 36 is not directly in contact with the P body region 50 underneath the emitter 40. Therefore, the P body region in the main thyristor portion of the device is electrically floated as compared to that of the P body region underneath the emitter 40, which is electrically grounded.

For the doping polarity show in FIG. 1, when a positive gate voltage with respect to the emitter 40 is applied to the gate 42 and 43, an N type inversion layer will be created in the channel formed by the trench gate 42 and the lateral gate 43. The channel created along the lateral gate 43 will connect the floating N+ emitter region 38 to that of the N+ region near emitter 40 to thereby establish a current path for electron current flow. The inversion layer created by gate 42 will be able to inject electrons into the N base region 34, which in turn calls for the injection of holes from collector 32 into the N base region 34. This process will initiate a positive feedback between electron current and hole current and eventually the main thyristor will turn-on. After thyristor turn-on, the main current flows vertically along the layers 32, 34, 36, and 38. Then, the main current flows laterally into the emitter region contact 40 via the lateral channel created underneath gate 43. After turn-on, when a gate voltage equal to or smaller than zero is applied to the gate 42 and 43, the N type inversion layer, discussed above, will disappear. The removal of the N type inversion layer underneath gate 43 will result in the interruption of the main current path causing the interruption of the main thyristor current path. The removal of the channel at 43 will stop the positive feedback between the electron current and hole current (i.e., the thyristor action). In a typical application involving this device, the load is typically inductive, therefore the load current would tend to remain constant. This constant current can only be provided in the described device by the removal of charges that were stored during the normal current conduction state. The removal of these charges from the N based region 34 will result in a rapid rise of the voltage in the device across terminal 30 and 40 (collector to emitter) until that voltage exceeds the maximum voltage in the circuit. At that point, the current in the circuit will flow to other paths and the described device current will decrease to zero and be completely turned-off.

The invented device can be fabricated using fabrication processes known in the art. In fabrication, a substrate material is used to define layer 32 and 34. Next, layer 36 is implanted with a typical charge of around $5 \times 10^{13}$ cm$^{-2}$ to $10^{14}$ cm$^{-2}$ and is driven to a junction depth of 3 to 5 um. Then, gate oxidation is used to form a thin oxide gate layer at the top of the wafer. The trench gate 42 is, then, formed with a mask using methods known in the art and a mask is also used to define gate 43. After defining gate 42 and 43, N+ layer 38 and N+ region underneath emitter 40 are implanted. The remainder process includes forming contact openings and metallization. In practice, the device would also include a junction termination region to support high voltage gate and emitter pad region for external packing consideration.

The advantage of the described device is in the introduction of the trench gate 42. In application, a device is formed by millions of cells like that shown in FIG. 1 connected. The current capacity of the device is determined by how many cells are in parallel, and the voltage of the device is determined by the vertical dimensions and doping of layer 34 and 36. For typical breakdown voltages of 600 V to 4500 V, the existence of gate 42 and its associated N type channel in the forward conduction state will increase the amount of electron current required to turn-on the device and the amount of electron current during current conduction. The increased amount of electron current for turn-on improves the turn-on speed of the device because there is more electron current injection at the beginning of the turn-on process. This will also reduce the voltage drop on the device during current conduction because beside the thyristor current path, the current path provided by gate 42 produces an additional current path. The switching speed is also improved because removal of the voltage on gate 42 will interrupt the additional current path rapidly based on a simple MOS operation mechanism.

What is claimed is:

1. A trench emitter controlled thyristor comprising:
   a drift region comprising a semiconductor having a first conductivity type;
   a collector region abutting a first surface of said drift region comprising a semiconductor having a second conductivity type;
   a body region abutting a second surface of said drift region opposite said first surface comprising a semiconductor having said second conductivity type;
   an emitter area abutting said body region at a first end thereof, said emitter area on a surface of said body region opposite said second surface;
   a floating region comprising a semiconductor of said first conductivity type abutting said body region at the end thereof opposite said first end;
   a first gate area spanning between said emitter area and said floating region; and,
   a second gate area spanning between said floating region and said drift region, wherein the major axis of said second gate area is oriented in a direction substantially perpendicular to the direction of the major axis of said first gate area.

2. The thyristor of claim 1 wherein said first conductivity type is N-type and said second conductivity type is P-type.

3. The thyristor of claim 2 wherein the conductivity of the portion of the body region adjacent the emitter is greater than the conductivity of the other portions of the body region.

4. The thyristor of claim 2 wherein the conductivity of the collector region is greater than the conductivity of the body region adjacent the floating region.

5. The thyristor of claim 1 wherein said second gate area is formed in a trench.

6. The thyristor of claim 5 wherein said second gate area spans from said first end of the body region to the opposite end of the body region.

7. The thyristor of claim 1 wherein said first gate area operates to turn off the thyristor.

8. The thyristor of claim 1 wherein said second gate area operates to turn on the thyristor.

9. The thyristor of claim 8 wherein said first gate area operates by establishing a channel region between said floating region and said drift region.

10. The thyristor of claim 9 wherein the total turn-on channel width to turn-off channel width ratio is approximately twice the ratio of the floating region length to floating region width.

11. A semiconductor device comprising:
- a stack of four layers of alternating semiconductor types;
- one of the external layers of said four layers not entirely covering its adjacent layer and having formed within the non-covered area an emitter; and,
- a first gate area spanning between said emitter and said one external layer; and,
- a second gate area spanning between said one external layer and the second layer from said one external layer, wherein the major axis of said second gate area is oriented in a direction substantially perpendicular to the direction of the major axis of said first gate area.

12. The device of claim 11 wherein said second gate area is formed in a trench.

13. The device of claim 12 wherein said trench extends substantially the same Length as said one external layer.

14. The device of claim 11 further comprising a third gate area spanning between said one external layer and said second layer therefrom on the opposite side of the device from said second gate area.

15. The device of claim 11 wherein the conductivity of the layer adjacent said external layer is not uniform across the layer.

16. The device of claim 15 wherein the conductivity of the layer adjacent said external layer is greater in the portion of the layer adjacent the emitter.

17. The device of claim 11 wherein the conductivity of said external layer is greater than the conductivity of the second layer from said external layer.

18. The device of claim 14 wherein the second and third gate areas turn on the device by establishing channels.

19. The device of claim 14 wherein said first gate area turns off the device.

20. The device of claim 14 wherein said second and third gate areas are electrically insulated from said layers.

21. The device of claim 11 wherein the emitter is formed within a portion of the noncovered area.

22. The device of claim 1 wherein the body region at the first end is separated from the body region at the end opposite the first end by the drift region.

* * * * *